United States Patent [19]

Shichida et al.

[11] Patent Number: 5,458,687
[45] Date of Patent: Oct. 17, 1995

[54] METHOD OF AND APPARATUS FOR SECURING AND COOLING/HEATING A WAFER

[75] Inventors: Hiroyuki Shichida; Naoyuki Tamura; Akitaka Makino, all of Kudamatsu, Japan

[73] Assignee: Hitachi, Ltd., Tokyo, Japan

[21] Appl. No.: 154,078

[22] Filed: Nov. 18, 1993

[30] Foreign Application Priority Data

Nov. 20, 1992 [JP] Japan .................... 4-311630

[51] Int. Cl.$^6$ .................... C23C 16/00
[52] U.S. Cl. .................... 118/724; 118/725; 118/728
[58] Field of Search .................... 118/728, 500, 118/724, 725; 156/345

[56] References Cited

U.S. PATENT DOCUMENTS

| | | | |
|---|---|---|---|
| 4,184,188 | 1/1980 | Briglia | 361/234 |
| 4,457,359 | 7/1984 | Holden | 165/80 C |
| 4,527,620 | 7/1985 | Pedersen | 165/80 |
| 4,565,601 | 1/1986 | Kakehi | 156/643 |
| 4,771,730 | 9/1988 | Tezuka | 118/723 |
| 4,911,812 | 3/1990 | Kudo | 204/192.32 |
| 5,033,538 | 7/1991 | Wagner | 165/80.1 |
| 5,213,349 | 5/1993 | Elliott | 279/128 |
| 5,290,381 | 3/1994 | Nozawa | 156/345 |
| 5,362,361 | 11/1994 | Tatsumi | 156/662 |
| 5,368,685 | 11/1994 | Kumihashi | 156/643 |

Primary Examiner—R. Bruce Breneman
Assistant Examiner—Jeffrie R. Lund
Attorney, Agent, or Firm—Antonelli, Terry, Stout & Kraus

[57] ABSTRACT

A wafer processing apparatus comprises a vacuum processing chamber, and a wafer holder disposed within the vacuum processing chamber to hold a wafer to be processed fixedly thereon by electrostatic attraction. A cooling or heating gas is supplied into the space between the surface of the wafer holder and the backside of a wafer set on the wafer holder to cool or heat the wafer. In case the electrostatic attraction disappears accidentally due to, for example, power failure, the cooling or heating gas in the space between the surface of the wafer holder and the backside of the wafer set on the wafer holder is discharged quickly upon the disappearance of the electrostatic attraction between the wafer holder and the wafer to prevent the wafer being caused to float and being dislocated by the pressure of the cooling or heating gas existing in the space between the surface of the wafer holder and the backside of the wafer.

10 Claims, 2 Drawing Sheets

METHOD OF AND APPARATUS FOR SECURING AND COOLING/HEATING A WAFER

BACKGROUND OF THE INVENTION

1. Field of the Invention

The present invention relates to a wafer processing apparatus for processing a wafer, such as a semiconductor wafer, in a vacuum chamber and, more particularly, to a wafer processing apparatus suitable for use as a plasma processing apparatus which needs to cool or heat the wafer during plasma processing.

2. Description of the Related Art

Formation of a minute pattern when fabricating solid state microelements for a semiconductor integrated circuit is one of the important uses of a plasma processing apparatus, such as a dry etching apparatus using microwave discharge. When processing a semiconductor wafer by a dry etching process, the compatibility of anisotropy and selectivity is an important characteristic of the dry etching process. Various efforts have been made to realize a dry etching process capable of securing the compatibility of anisotropy and selectivity. A low-temperature etching technique using an ion-assisted reaction is essential to forming a submicron pattern.

When forming a submicron pattern on a wafer, the wafer is heated by heat generated by the chemical reaction of the wafer and plasma, and the energy of incident ions and electrons and, consequently, the temperature of the wafer rises. To suppress the rise of the temperature of the wafer, a wafer holder holding the wafer is cooled with a cooling medium, such as water, methanol or liquid nitrogen, the wafer is held in close contact with the surface of the wafer holder by electrostatic attraction to transfer heat efficiently from the wafer to the wafer holder, and the space between the wafer and the wafer holder is filled with a heat transferring gas, such as He gas, of a pressure in the range of about 1 torr to about 10 torr to transfer heat efficiently from the wafer to the wafer holder for efficient cooling of the wafer.

Alternatively, in some applications, it is preferable to provide a heating gas. For ease of discussion, the following description will be directed to cooling, noting, however, that the present invention can be directed to systems using heating gas as well.

A vacuum processing apparatus provided with such means for cooling the wafer is disclosed, for example, in U.S. Pat. No. 4,771,730. This known vacuum processing apparatus supplies a cooling gas, such as $N_2$ gas, Ar gas or He gas, into the minute space between the surface of a wafer holder and the backside of a wafer so that heat is transferred efficiently from the wafer to the wafer holder, which is cooled sufficiently, to cool the wafer. This vacuum processing apparatus employs electrostatic attraction to hold the wafer in close contact with the wafer holder and is not provided with any wafer clamping mechanism. The omission of the wafer clamping mechanism prevents insulation failure and the like attributable to fine particles chipped off from the component parts of the wafer clamping mechanism during plasma processing and adhering to the wafer.

However, although electrostatic attraction is effective while the plasma processing apparatus is in operation, the electrostatic attraction disappears when the plasma disappears due to the instantaneous failure of the main power source, the failure of the power source for the microwave generator or the failure of the RF power source. Since the cooling gas is supplied into the space between the surface of the wafer holder and the backside of the wafer, the wafer is caused to float by the pressure of the cooling gas, the wafer is dislocated and, if things come to the worst, the wafer will fall off the wafer holder. A method employing a wafer holder provided with a dielectric film having a large dielectric constant to increase the residual electric charge remaining after the wafer holder has been disconnected from the power source may be able to enhance the residual electrostatic attraction. However, this methods increases the time necessary for removing electrostatic charge in the normal operation of the apparatus, which increases the wafer processing cycle time and reduces the throughput of the apparatus. Accordingly, this method is not practical.

SUMMARY OF THE INVENTION

Accordingly, it is an object of the present invention to provide an improved wafer processing apparatus.

Another object of the present invention is to provide a wafer processing apparatus capable of securely holding a wafer on a wafer holder even if electrostatic attraction holding the wafer in close contact with the wafer holder disappears due to instantaneous power failure.

To achieve the foregoing objects, the present invention provides a wafer processing apparatus comprising: a vacuum chamber having a wafer holder for supporting a wafer thereon, placed within the vacuum chamber; an electrostatic attraction mechanism for holding the wafer in close contact with the surface of the wafer holder by electrostatic attraction; a cooling system for cooling the wafer holder; a cooling gas source from which a cooling gas is supplied into the space between the surface of the wafer holder and the backside of a wafer mounted on the wafer holder; and a cooling gas supply system for supplying the cooling gas from the cooling gas source into the space between the surface of the wafer table and the backside of the wafer; a flow passage extended between the space between the surface of the wafer holder and the backside of the wafer, and the vacuum vessel; and a flow passage opening/closing mechanism which keeps the flow passage closed during the normal operation of the electrostatic attraction mechanism and opens the flow passage upon the occurrence of the malfunction of the electrostatic attraction mechanism due to power failure or accidental trouble to enable the cooling gas filling up the space between the surface of the wafer holder and the backside of the wafer to be bypassed through the flow passage into the vacuum chamber of a reduced pressure so that the wafer will not caused to be dislocated by the pressure of the cooling gas filling up the space between the surface of the wafer holder and the backside of the wafer.

As noted above, the present invention is also applicable to arrangements using heating gas instead of cooling gas.

BRIEF DESCRIPTION OF THE DRAWINGS

The above and other objects, features and advantages of the present invention will become more apparent from the following description taken in connection with the accompanying drawings, in which.

DETAILED DESCRIPTION OF THE PREFERRED EMBODIMENTS

Figure 1:
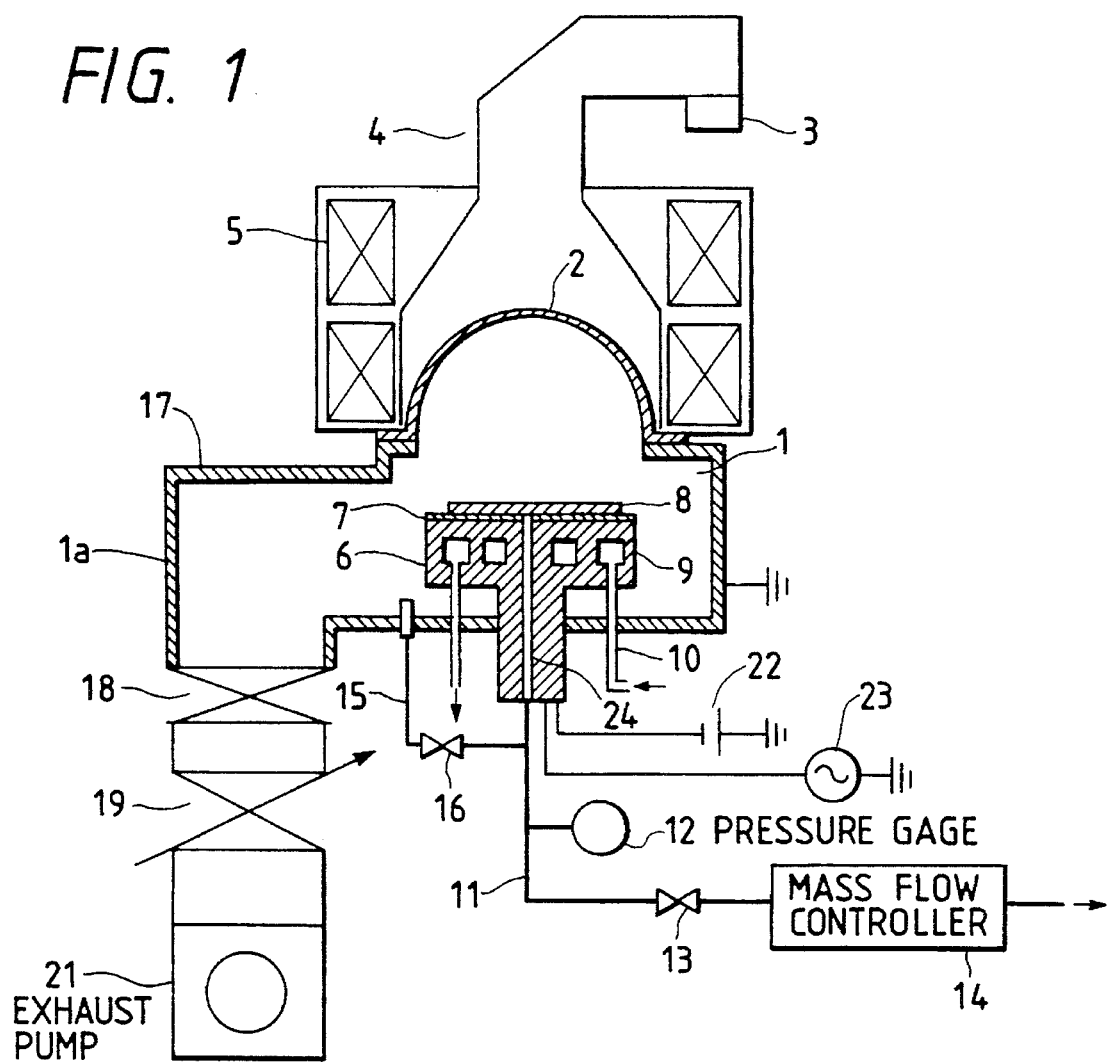
FIG. 1 is a side view of a wafer processing apparatus in a preferred embodiment according to the present invention.

Referring to FIG. 1, a wafer holder 6 having an upper surface coated with a dielectric film 7 is placed in a vacuum processing chamber 1, and a wafer 8 is mounted on the wafer holder 6. The wafer 8 is conveyed onto and carried away from the wafer holder 6 by a conveying mechanism, not shown. The wafer 8 is seated on the dielectric film 7 coating the upper surface of the wafer holder 6. A negative voltage is applied to the wafer holder 6 by a dc power source 22, and a wall 1a of the vacuum processing chamber 1 is grounded. Accordingly, when a plasma is produced within the vacuum processing chamber 1, opposite electric charges accumulate on the opposite sides of the dielectric film 7, respectively, specifically, negative electric charge will accumulate on the wafer holder 6 and positive electric charge will accumulate on the wafer 8, to apply electrostatic attraction to the wafer 8 and. Consequently, the wafer 8 is held securely on the wafer holder 6 by the electrostatic attraction.

An opening formed in the upper wall of the vacuum processing chamber 1 is covered with a quartz bell jar 2, and a waveguide 4 is mounted on top of the vacuum processing chamber 1 over the bell jar 2 so as to be disposed opposite to the wafer holder 6. The waveguide 4 is provided at its one end with a magnetron 3 which produce microwave radiation. A solenoid 5 for creating a magnetic field within the vacuum processing chamber 1 is disposed so as to surround the vacuum processing chamber 1. A gas supply line, not shown, for supplying a processing gas into the vacuum processing chamber 1 is connected to the vacuum processing chamber 1. An exhaust pump 21 for evacuating the vacuum processing chamber 1 is connected to the vacuum processing chamber 1 with an exhaust pipe 17. The exhaust pipe 17 is provided with a gate valve 18, and a conductance regulating valve 19 for properly regulating the pressure in the vacuum processing chamber 1. The wafer holder 6 is provided internally with a cooling medium passage 9 through which a cooling medium is circulated. The cooling medium passage 9 is connected to a temperature regulator, not shown, with a cooling medium circulating piping system 10. The cooling medium is circulated through the cooling medium passage 9 to cool the wafer holder 6 by several tens of degrees centigrade. A high-frequency power source 23 is connected through a matching circuit, not shown, to the wafer holder 6, and a dc power source 22 is connected through a high-frequency cut-off circuit, not shown, to the wafer holder 6.

Figure 2:
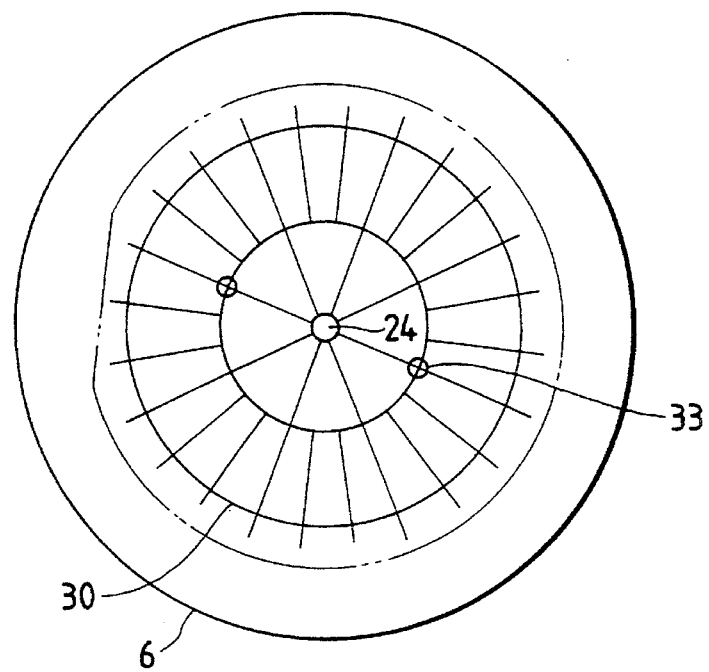
FIG. 2 is a top plan view of a wafer holder included in the wafer processing apparatus shown in FIG. 1.

A cooling gas supply passages (flow rate) 24 is formed through the wafer holder 6 to supply a cooling gas through the dielectric film 7 into the space between the dielectric film 7 and the backside of the wafer 8, and a cooling gas supply line 11 is connected to the cooling gas supply passage 24. A cooling gas, such as He gas, is supplied through a mass flow controller 14 provided on the cooling gas supply line 11 into the space between the dielectric film 7 and the backside of the wafer 8. As shown in FIG. 2, grooves 30 are formed in an area of the dielectric film 7 corresponding to the wafer 8 to facilitate the spread of the cooling gas under the entire backside of the wafer 8. Thus, the pressure of the cooling gas substantially equal to the pressure in the cooling gas supply line 11 acts uniformly over the entire backside of the wafer 8. A pressure gage 12 is provided on the cooling gas supply line 11. The pressure of the cooling gas is regulated according to the temperature of the wafer 8 measured by a temperature sensor, not shown, so that the heat transfer rate of the cooling gas is maintained at an appropriate value.

A discharge line (gas flow line) 15 has one end connected to the cooling gas supply line 11 at a position below a solenoid valve 13, which is closed when the solenoid is not energized, provided on the cooling gas supply line 11, and the other end connected to a connecting pipe 50 penetrating and fixed to the wall of the vacuum processing chamber 1. The discharge line 15 is provided with a solenoid valve 16, which is open when the solenoid is not energized, and closed when the solenoid is energized. If the exhaust pump 21 stops due to power failure, the solenoid valve 13 closes to stop the supply of cooling gas, and the solenoid valve 16 opens to allow the cooling gas within the cooling gas supply line 11 to flow through the discharge line 15 into the vacuum processing chamber 1 having a volume several hundreds to several thousands times the volume of the interior space of the cooling gas supply line 11 and, consequently, the pressures within the vacuum processing chamber 1, the cooling gas supply line 11 and the cooling gas passage 24 are equalized. The discharge line 15 is formed of a pipe, for example, a pipe of ½ in. in outside diameter, having a flow passage area greater than that of a pipe, for example, a pipe of ¼ in. in outside diameter, forming the cooling gas supply line 11 to enable the cooling gas within the cooling gas supply line 11 to flow smoothly and quickly through the discharge line 15 into the vacuum processing chamber 1.

Figure 3:
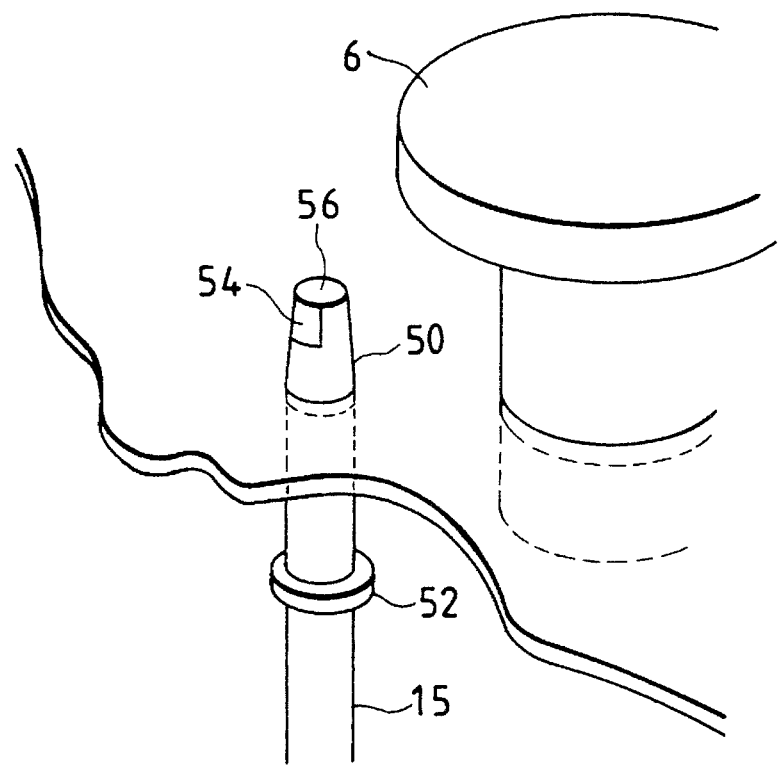
FIG. 3 is an enlarged fragmentary view of an essential portion of the wafer processing apparatus shown in FIG. 1.

As shown in FIG. 3, the connecting pipe 50 has an upper end closed by a lid 56 and provided with an opening 54, and a lower end connected to the pipe forming the discharge line 15 by a pipe fitting 52. The connecting pipe 50 is fixed to the wall of the vacuum processing chamber 1 with the opening 54 thereof facing away from the wafer holder 6. Therefore, the cooling gas is discharged through the opening 54 in a direction away from the wafer 8 and hence there is no possibility that the wafer 8 is contaminated with the cooling gas discharged through the opening 54.

Figure 4A:
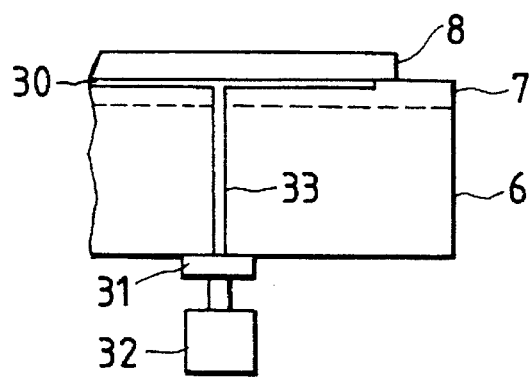
FIGS. 4(a) and 4(b) are side views of a cooling gas discharging mechanism employed in a wafer processing apparatus in another embodiment according to the present invention.
Figure 4B:
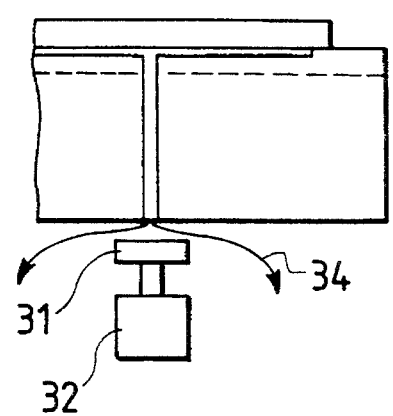

As shown in FIGS. 4(a) and 4(b), at least one gas vent (gas flow line) 33 communicating with the groove 30 is formed in the wafer holder 6. Normally, a valve 31 is pressed against the outlet of the gas vent 33 by an actuator 32, such as a solenoid actuator, to close the gas vent 33 as shown in FIG. 4(a). When power failure occurs, the actuator 32 is de-energized and the valve 31 is moved away from the outlet of the gas vent 33 to enable the cooling gas 34 within the groove 30 to be sucked into the vacuum processing chamber 1 so that the pressure acting on the backside of the wafer 8 drops quickly to the pressure in the vacuum processing chamber 1.

Thus, the pressure of the cooling gas acting on the backside of the wafer 8 and the pressure in the vacuum processing chamber can be quickly equalized in case of power failure to prevent the separation of the wafer from the wafer holder by the difference between the pressure of the cooling gas acting on the backside of the wafer and the pressure in the vacuum processing chamber. Accordingly, the wafer processing apparatus need not be provided with any wafer clamping mechanism, which is necessary for holding the wafer on the wafer holder in the conventional wafer processing apparatus, and the wafer processing apparatus does not produce dust that will contaminate the wafer. Obviously, the present invention is applicable to clampless wafer processing apparatuses using a cooling gas for cooling the wafer other than the wafer processing apparatus specifically described herein, including those employing parallel electrodes and those using a plasma.

It should be noted that gas supplied between a wafer and a wafer holder serves as cooling gas when the wafer is cooled, while it serves as heating gas when the wafer is heated, that is, such gas functions as thermal transfer gas to conduct the temperature at the top surface of the sample holder toward the wafer.

Although the invention has been described in its preferred form with a certain degree of particularity, obviously many changes and variations are possible therein. It is therefore to be understood that the present invention may be practiced otherwise than as specifically described herein without departing from the scope and spirit thereof.

What is claimed is:

1. A wafer processing apparatus comprising:

a vacuum processing chamber;

a wafer holder disposed within the vacuum processing chamber to hold a wafer thereon;

an electrostatic attracting means for electrostatically attracting the wafer set on the wafer holder to the wafer holder;

a wafer holder cooling/heating means for cooling/heating the wafer holder;

a cooling/heating gas source from which a cooling/heating gas is to be supplied into the space between the surface of the wafer holder and the backside of the wafer set on the wafer holder;

a cooling/heating gas supply line through which the cooling/heating gas is supplied from the cooling/heating gas source into the space between the surface of the wafer holder and the backside of the wafer set on the wafer holder;

a cooling/heating gas flow line through which the cooling/heating gas is flowed from the space between the surface of the wafer holder and the backside of the wafer set on the wafer holder into the vacuum processing chamber; and a cooling/heating gas flow line opening/closing mechanism which keeps the cooling/heating gas flow line closed while the electrostatic attracting means is in normal operation and opens the cooling/heating gas flow line upon the interruption of the normal operation of the electrostatic attracting means.

2. A wafer processing apparatus according to claim 1, wherein both the cooling/heating gas supply line and the cooling/heating gas flow line are connected to a flow passage formed in the wafer holder.

3. A wafer processing apparatus comprising:

a vacuum processing chamber;

a wafer holder disposed within the vacuum processing chamber to hold a wafer thereon;

an electrostatic attracting means for electrostatically attracting the wafer set on the wafer holder to the wafer holder;

a wafer holder cooling/heating means for cooling/heating the wafer holder;

a cooling/heating gas source from which a cooling/heating gas is to be supplied into the space between the surface of the wafer holder and the backside of the wafer set on the wafer holder;

a cooling/heating gas supply line through which the cooling/heating gas is supplied from the cooling/heating gas source into the space between the surface of the wafer holder and the backside of the wafer set on the wafer holder;

a cooling/heating gas flow line through which the cooling/heating gas is flowed from the space between the surface of the wafer holder and the backside of the wafer set on the wafer holder into the vacuum processing chamber, having one end connected to the cooling/heating gas supply line and the other end connected to the vacuum processing chamber; and a valve which is provided on the cooling/heating gas flow line, remains closed while the electrostatic attracting means is in normal operation and opens upon the interruption of the normal operation of the electrostatic attracting means.

4. A wafer processing apparatus according to claim 3, wherein a valve which operates in a mode reverse to that in which the valve provided on the cooling/heating gas flow line is provided on the cooling/heating gas supply line at a position above the junction of the cooling/heating gas supply line and the cooling/heating gas flow line with respect to the flowing direction of the cooling/heating gas.

5. A wafer processing apparatus according to claim 3, wherein a connecting pipe penetrating the bottom wall of the vacuum processing chamber is fixed to the bottom wall of said vacuum processing chamber, the connecting pipe has a lower end connected to the cooling/heating gas flow line and an upper end provided with an opening facing away from the wafer holder.

6. A wafer processing apparatus according to claim 5, wherein the inside diameter of a pipe forming the cooling/heating gas flow line is greater than that of a pipe forming the cooling/heating gas supply line.

7. A wafer processing apparatus comprising:

a wafer setting means for setting a wafer to be processed on a wafer holder disposed within a vacuum processing chamber;

an electrostatic attracting means for electrostatically attracting the wafer set on the wafer holder to the wafer holder;

a wafer holder cooling/heating means for cooling/heating the wafer holder;

a cooling/heating gas supply means for supplying a cooling/heating gas into the space between the surface of the wafer holder and the backside of the wafer set on the wafer holder; and a cooling/heating gas flow means for causing the cooling/heating gas in the space between the surface of the wafer holder and the backside of the wafer set on the wafer holder to flow into the vacuum processing chamber when the electrostatic attraction between the wafer and the wafer holder is removed.

8. A wafer processing apparatus comprising:

a wafer setting means for setting a wafer to be processed on a wafer holder disposed within a vacuum processing chamber;

an electrostatic attracting means for electrostatically attracting the wafer set on the wafer holder to the wafer holder;

a wafer holder cooling/heating means for cooling/heating the wafer holder;

a cooling/heating gas supply means for supplying a cooling/heating gas into the space between the surface of the wafer holder and the backside of the wafer set on the wafer holder;

a pressure control means for controlling the pressure of the cooling/heating gas in the space between the surface of the wafer holder and the backside of the wafer set on the wafer holder; and a cooling/heating gas flowing means for causing the cooling/heating gas in the space between the surface of the wafer holder and the backside of the wafer set on the wafer holder to flow into the vacuum processing chamber upon removal of the electrostatic attraction between the wafer set on the wafer holder and the wafer holder.

9. A wafer processing method comprising steps of:

setting a wafer to be processed on a wafer holder disposed within a vacuum processing chamber;

electrostatically attracting the wafer set on the wafer holder to the wafer holder;

cooling/heating the wafer holder;

supplying a cooling/heating gas into the space between the surface of the wafer holder and the backside of the wafer set on the wafer holder; and causing the cooling/heating gas in the space between the surface of the wafer holder and the backside of the wafer set on the wafer holder to flow into the vacuum processing chamber upon removal of electrostatic attraction between the wafer holder and the wafer set on the wafer holder, 10. A wafer processing method comprising steps of:

setting a wafer to be processed on a wafer holder disposed within a vacuum processing chamber;

electrostatically attracting the wafer set on the wafer holder to the wafer holder;

supplying a cooling/heating gas into the space between the surface of the wafer holder and the backside of the wafer set on the wafer holder;

controlling the pressure of the cooling/heating gas in the space between the surface of the wafer holder and the backside of the wafer set on the wafer holder; and causing the cooling/heating gas in the space between the surface of the wafer holder and the backside of the wafer set on the wafer holder to flow into the vacuum processing chamber upon removal of electrostatic attraction between the wafer holder and the wafer set on the wafer holder.

* * * * *